(12) United States Patent
Mun et al.

(10) Patent No.: US 9,078,344 B2
(45) Date of Patent: Jul. 7, 2015

(54) PRINTED CIRCUIT BOARD AND MANUFACTURING METHOD THEREOF

(75) Inventors: Kyung Don Mun, Gyeonggi-do (KR); Kil Yong Yun, Gyeonggi-do (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 133 days.

(21) Appl. No.: 13/484,823

(22) Filed: May 31, 2012

(65) Prior Publication Data

US 2013/0128472 A1    May 23, 2013

(30) Foreign Application Priority Data

Nov. 23, 2011    (KR) .................... 10-2011-0122982

(51) Int. Cl.
*H05K 3/00* (2006.01)
*H05K 3/04* (2006.01)
*H05K 1/11* (2006.01)
*H05K 3/46* (2006.01)

(52) U.S. Cl.
CPC ........... *H05K 3/007* (2013.01); *Y10T 29/49126* (2015.01); *H05K 1/116* (2013.01); *H05K 3/0097* (2013.01); *H05K 3/045* (2013.01); *H05K 3/4652* (2013.01); *H05K 2201/0376* (2013.01); *H05K 2201/09509* (2013.01); *H05K 2201/09545* (2013.01)

(58) Field of Classification Search
CPC ....................................................... H05K 3/40
See application file for complete search history.

(56) References Cited

U.S. PATENT DOCUMENTS

| | | | |
|---|---|---|---|
| 6,555,762 B2* | 4/2003 | Appelt et al. ................. | 174/264 |
| 6,977,348 B2* | 12/2005 | Ho et al. ....................... | 174/255 |
| 7,076,869 B2* | 7/2006 | Curcio et al. ................. | 29/852 |
| 7,548,430 B1* | 6/2009 | Huemoeller et al. ......... | 361/760 |
| 2008/0283491 A1* | 11/2008 | Arai et al. .................... | 216/18 |
| 2009/0255722 A1* | 10/2009 | Lee et al. ...................... | 174/264 |
| 2009/0294164 A1* | 12/2009 | Kim et al. ..................... | 174/262 |
| 2010/0263923 A1* | 10/2010 | Kodani et al. ................ | 174/260 |

FOREIGN PATENT DOCUMENTS

| | | |
|---|---|---|
| JP | 2004-265967 | 9/2004 |
| KR | 10-0674305 | 1/2007 |
| KR | 10-2009-0002718 | 1/2009 |
| KR | 10-2009-0109430 | 10/2009 |
| KR | 10-2011-0036147 | 4/2011 |

(Continued)

OTHER PUBLICATIONS

Korean Notice of Allowance issued May 16, 2013 in corresponding Korean Patent Application No. 10-2011-0122982.

(Continued)

*Primary Examiner* — Timothy Thompson
*Assistant Examiner* — Krystal Robinson

(57) ABSTRACT

A printed circuit board includes: a first insulating layer; a second insulating layer of which one surface is formed to be in contact with the other surface of the first insulating layer; a first circuit pattern formed to be embedded in one surface of the first insulating layer; a second circuit pattern formed to be embedded between the first insulating layer and the second insulating layer; a third circuit pattern formed to be protruded from the other surface of the second insulating layer; and a landless fill-plating layer for filling a hole which penetrates the first insulating layer.

5 Claims, 8 Drawing Sheets

(56) References Cited

FOREIGN PATENT DOCUMENTS

| KR | 10-2011-0045274 | 5/2011 |
|----|-----------------|--------|
| KR | 10-2011-0060326 | 6/2011 |

OTHER PUBLICATIONS

Korean Office Action issued on Dec. 6, 2012 in corresponding Korean Patent Application No. 10-2011-0122982.

* cited by examiner

US 9,078,344 B2

PRINTED CIRCUIT BOARD AND MANUFACTURING METHOD THEREOF

CROSS-REFERENCE TO RELATED APPLICATIONS

This application claims the benefit under 35 U.S.C. Section 119 of Korean Patent Application Serial No. 10-2011-0122982, entitled filed Nov. 23, 2011, which is hereby incorporated by reference in its entirety into this application.

BACKGROUND OF THE INVENTION

1. Field of the Invention

The present invention relates to a printed circuit board and a manufacturing method thereof, and more particularly, to a printed circuit board capable of being highly integrated as well as being thin by embedding a circuit pattern in an insulating layer, and a manufacturing method thereof.

2. Description of the Related Art

A printed circuit board is a component which connects various electronic components to a printed circuit substrate according to a circuit design of electrical wiring or supports the components.

In recent times, due to development of electronics industry, there is a rapidly increasing demand for high function and miniaturization of electronic components, and there is also a demand for high density wiring and thinning of a printed circuit board on which the electronic components are mounted.

RELATED ART DOCUMENT

Patent Document 1: Korean Patent No.: 10-0674305

SUMMARY OF THE INVENTION

The present invention has been invented in order to overcome the above-described problems and it is, therefore, an object of the present invention to provide a printed circuit board capable of reducing a thickness of the entire board by embedding a circuit pattern in an insulating layer and forming a fine pitch circuit by forming a landless fill-plating layer.

In accordance with one aspect of the present invention to achieve the object, there is provided a method of manufacturing a printed circuit board including the steps of: forming a first circuit pattern on a metal layer formed on one surface of a base substrate; forming a second circuit pattern after laminating a first insulating layer in which the first circuit pattern is embedded; sequentially laminating a second insulating layer and a preliminary third circuit pattern on the second circuit pattern; separating the base substrate and forming a hole in the separated substrate; and forming a third circuit pattern, a landless first fill-plating layer, and a second fill-plating layer by performing fill-plating on the entire surface of the substrate in which the hole is formed, forming an insulating film layer on the other surface of the substrate, and performing an etching process on one surface and the other surface of the substrate.

The step of forming the first circuit pattern may include the steps of: forming the metal layer on the base substrate; and forming the first circuit pattern to be protruded from the metal layer.

The first circuit pattern and the metal layer may be made of a copper foil.

The step of forming the hole may further include a first removal process of opening a region, where the hole is to be formed, by removing a portion of each of the first circuit pattern and the preliminary third circuit pattern of the substrate.

The step of forming the hole may further include a second removal process of forming the hole by removing the first and second insulating layers exposed by the first removal process.

The second removal process may be a process using carbon dioxide ($CO_2$) laser.

The first fill-plating layer may be formed inside the first insulating layer.

The second fill-plating layer may be formed inside the second insulating layer.

The third circuit pattern may be formed to be protruded from the exposed surface of the second insulating layer.

In accordance with another aspect of the present invention to achieve the object, there is provided a printed circuit board including: a first insulating layer; a second insulating layer of which one surface is formed to be in contact with the other surface of the first insulating layer; a first circuit pattern formed to be embedded in one surface of the first insulating layer; a second circuit pattern formed to be embedded between the first insulating layer and the second insulating layer; a third circuit pattern formed to be protruded from the other surface of the second insulating layer; and a landless fill-plating layer for filling a hole which penetrates the first insulating layer.

The printed circuit board may further include a land fill-plating layer for filling a hole which penetrates the second insulating layer.

The third printed circuit board may be formed by laminating a remaining pattern of a preliminary third circuit pattern and a remaining pattern of a second preliminary fill-plating layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 2 to 14 are cross-sectional views showing a method of manufacturing the printed circuit board in accordance with an embodiment of the present invention, wherein FIG. 2 is a cross-sectional view showing a metal layer formed on a base substrate, FIG. 3 is a cross-sectional view showing a first insulating film layer formed on the substrate on which the metal layer is formed, FIG. 4 is a cross-sectional view showing a first circuit pattern embedded in an exposed portion of the first insulating film layer, FIG. 5 is a cross-sectional view showing that the first insulating film layer is removed from the base substrate, FIG. 6 is a cross-sectional view showing a first insulating layer and a preliminary second circuit pattern formed on the base substrate from which the first insulating film layer is removed, FIG. 7 is a cross-sectional view showing a second circuit pattern formed on the first insulating layer, FIG. 8 is a cross-sectional view showing a second insulating layer and a preliminary third circuit pattern formed on the base substrate on which the second circuit pattern is formed, FIG. 9 is a cross-sectional view showing that the base substrate is separated, FIG. 10 is a cross-sectional view showing that regions in which a first fill-plating layer and a second fill-plating layer are to be formed are opened in the separated substrate, FIG. 11 is a cross-sectional view showing first and second vias formed through the first and second insulating layers, FIG. 12 is a cross-sectional view showing a preliminary fill-plating layer embedded in the first and second vias, FIG. 13 is a cross-sectional view showing a second insulating film layer formed on one surface of the substrate on which the preliminary fill-plating layer is formed, and FIG. 14 is a cross-sectional view showing the first fill-plating layer, the second fill-plating layer, and a third circuit pattern formed on the substrate; and FIGS. 15 to 19 are plan views and cross-sectional views taken along I-I' of the plan views showing a method of manufacturing the fill-plating layer and the second circuit pattern of the present invention, wherein FIG. 15 is a plan view and a cross-sectional view showing the first circuit pattern formed on the first insulating layer, FIG. 16 is a, plan view and a cross-sectional view showing the substrate of which a region, where the first fill-plating layer is to be formed, is opened, FIG. 17 is a plan view and a cross-sectional view showing the substrate in which the first via is formed, FIG. 18 is a plan view and a cross-sectional view showing the preliminary fill-plating layer embedded in the first via; and FIG. 19 is a plan view and a cross-sectional view showing the substrate on which the fill-plating layer is formed.

DETAILED DESCRIPTION OF THE PREFERABLE EMBODIMENTS

Hereinafter, embodiments of the present invention will be described with reference to the accompanying drawings. However, the following embodiments are provided as examples but are not intended to limit the present invention thereto.

Descriptions of well-known components and processing techniques are omitted so as not to unnecessarily obscure the embodiments of the present invention. The following terms are defined in consideration of functions of the present invention and may be changed according to users or operator's intentions or customs. Thus, the terms shall be defined based on the contents described throughout the specification.

The technical spirit of the present invention should be defined by the appended claims, and the following embodiments are merely examples for efficiently describing the technical spirit of the present invention to those skilled in the art.

Hereinafter, a printed circuit board in accordance with embodiments of the present invention will be described with reference to the accompanying drawings.

Figure 1:
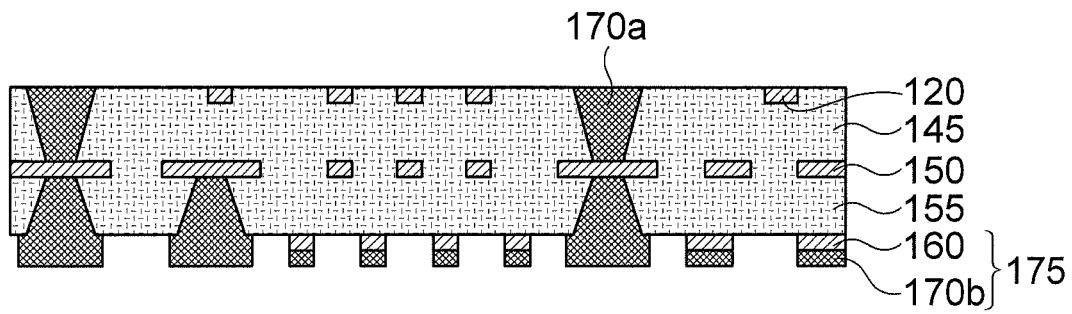
FIG. 1 is a view showing a printed circuit board in accordance with an embodiment of the present invention.

FIG. 1 is a view showing a printed circuit board in accordance with a first embodiment of the present invention.

As shown in FIG. 1, a printed circuit board in accordance with a first embodiment of the present invention includes a first insulating layer 145, a second insulating layer 155 formed to correspond to a lower surface of the first insulating layer 145, a first circuit pattern 120 formed to be embedded in an upper surface of the first insulating layer 145, a second circuit pattern 150 formed between the first insulating layer 145 and the second insulating layer 155, and a third circuit pattern 175 formed to protrude from an exposed surface (lower surface in the drawing) of the second insulating layer 155.

As in FIG. 1, the third circuit pattern 175 in accordance with the present invention may be formed by laminating a remaining pattern 160 of a preliminary third circuit pattern 160a and a remaining pattern 170 of a second preliminary fill-plating layer 170b'.

In addition, the printed circuit board in accordance with the present invention may further include a first fill-plating layer 170a formed to fill a hole inside the first insulating layer 145.

At this time, the first fill-plating layer 170a in accordance with the present invention may be formed as a landless fill-plating layer without a land. Accordingly, a pitch of the first fill-plating layer 170a is reduced than a pitch of a second fill-plating layer 170b with a land. Therefore, it is possible to implement miniaturization of the circuit pattern.

In addition, the printed circuit board in accordance with the present invention may further include the second fill-plating layer 170b formed to fill a hole inside the second insulating layer 155.

At this time, as in FIG. 1, the second fill-plating layer 170b in accordance with the present invention may have a land. However, the second fill-plating layer 170b also may not have a land like the first fill-plating layer 170a according to a design change of those skilled in the art without being limited to an embodiment of the present invention.

Like this, the printed circuit board in accordance with the present invention can reduce the entire thickness of the printed circuit board by removing the land of the fill-plating layer as well as embedding the circuit pattern in the insulating layer exposed to the outside. Accordingly, the printed circuit board in accordance with the present invention can implement miniaturization of the circuit pattern.

FIGS. 2 to 14 are cross-sectional views sequentially showing a method of manufacturing a printed circuit board in accordance with an embodiment of the present invention.

Figure 2:
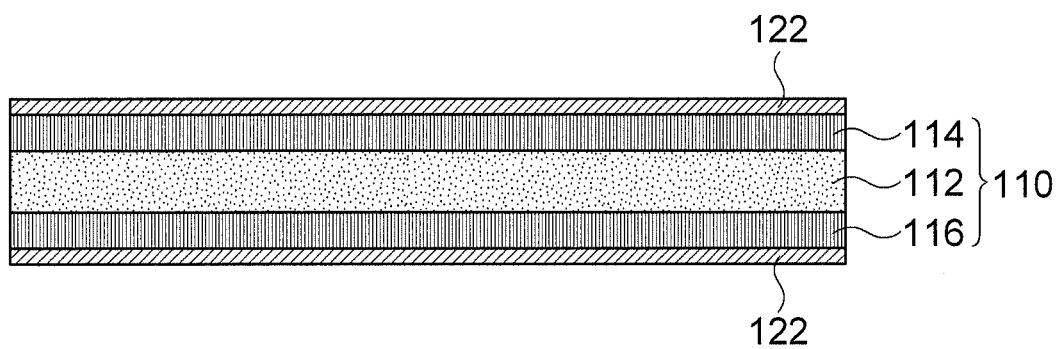

First, according to FIG. 2, metal layers 122 are formed on both surfaces of a base substrate 110.

More specifically, after preparing the base substrate 110, a metal material is applied on the both surfaces of the base substrate 110 to form the metal layers 122. At this time, for example, the metal material may be a copper foil.

Meanwhile, the base substrate 110 in the present invention may be configured by sequentially laminating a first carrier 114, prepreg 112, and a second carrier 116. The first and second carriers 114 and 116 may be made of the same material, for example, a copper foil.

Figure 3:
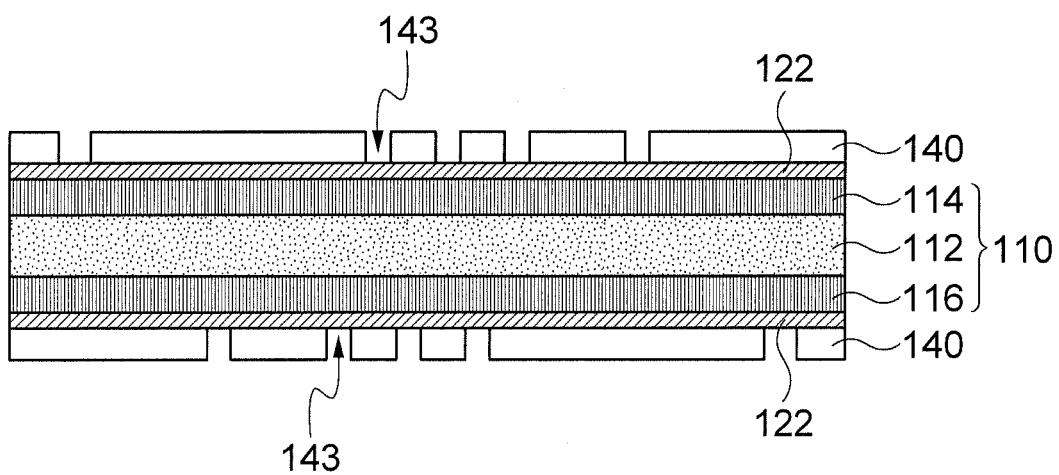

Next, according to FIG. 3, first insulating film layers 140 are formed on the both surfaces of the base substrate 110 on which the metal layers 122 are formed.

More specifically, after applying a photosensitive material on the both surfaces of the base substrate 110 on which the metal layers 122 are formed, exposure and developing processes are performed to form the first insulating film layers 140 with exposed portions 143 for exposing portions of the surfaces of the metal layers 122.

At this time, the photosensitive material may be various photosensitive materials such as a dry film, photo resist, and photo solder resist as in an embodiment of the present invention and can be replaced with various materials without being limited to the above materials.

Figure 4:
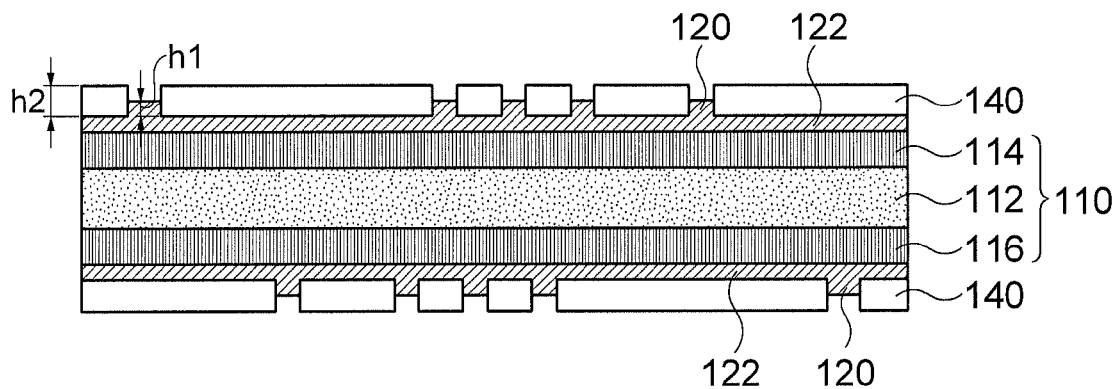

According to FIG. 4, a first circuit pattern 120 is formed in the exposed portion 143 of the first insulating film layer 140.

More specifically, after forming a metal layer (not shown) to cover the base substrate 110 on which the first insulating film layer 140 is formed, an etching process using a developing solution is performed on the base substrate 110, on which the metal layer is formed, to form the first circuit pattern 120 which is embedded in the exposed portion 143 of the first insulating film layer 140.

At this time, for example, a height h1 of the first circuit pattern 120 may be formed smaller than a height h2 of the first insulating film layer 140. Then, it is possible to prevent the first circuit pattern 120 from being removed together in a subsequent process of removing the first insulating film layer 140.

For example, the first circuit pattern 120 in accordance with the present invention may be made of a copper foil.

Figure 5:
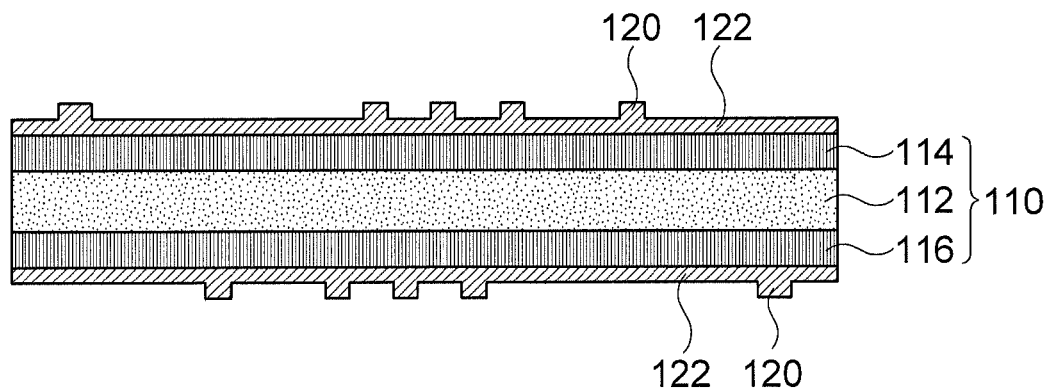

According to FIG. 5, the first insulating film layers 140 formed on the both surfaces of the base substrate 110 are removed.

More specifically, an etching process is performed on the entire surface of the base substrate 110 on which the first circuit patterns 120 are formed to remove only the first insulating film layers 140.

Figure 6:
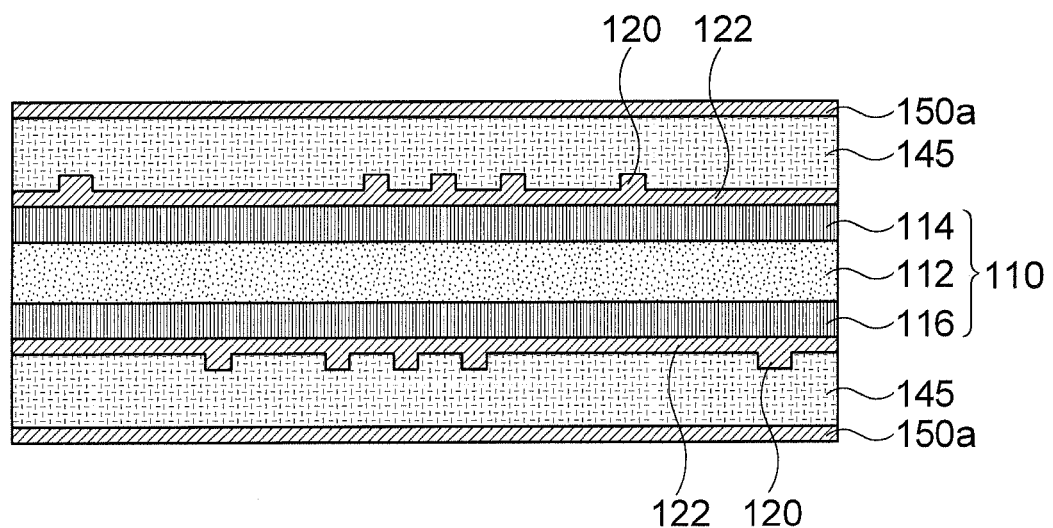

According to FIG. 6, first insulating layers 145 and preliminary second circuit patterns 150a are sequentially formed on the both surfaces of the base substrate 110 on which the first circuit patterns 120 are formed.

More specifically, the first insulating layers 145 and the preliminary second circuit patterns 150a are formed by sequentially laminating an insulating material and a metal material on the both surfaces of the base substrate 110 on which the first circuit patterns 120 are formed.

Here, the first circuit pattern 120 may be formed to be inserted inside the first insulating layer 145.

Figure 7:
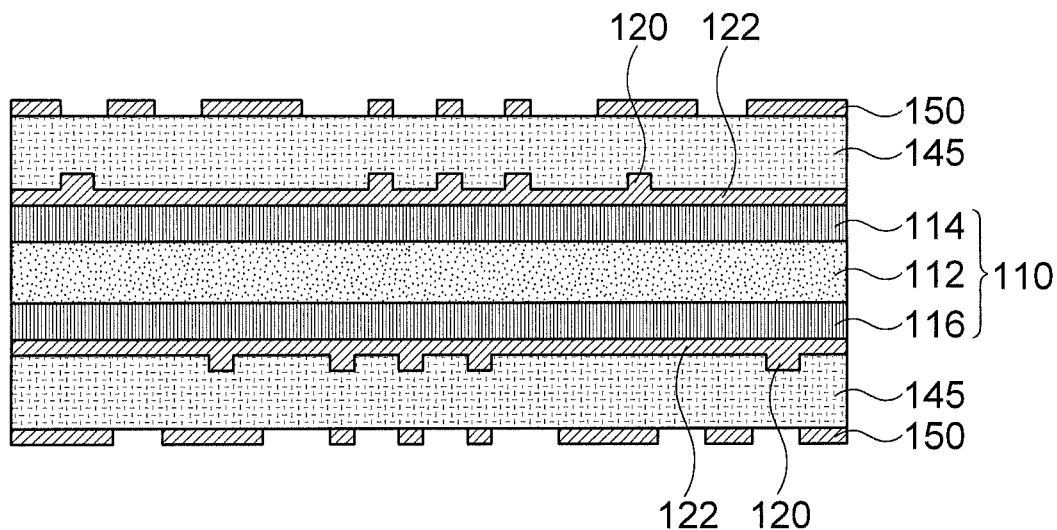

According to FIG. 7, a second circuit pattern 150 is formed on a surface of the first insulating layer 145.

More specifically, etching and patterning processes are performed on a predetermined portion of the preliminary second circuit pattern 150a to form the second circuit pattern 150 which exposes a portion of the surface of the first insulating layer 145.

Figure 8:
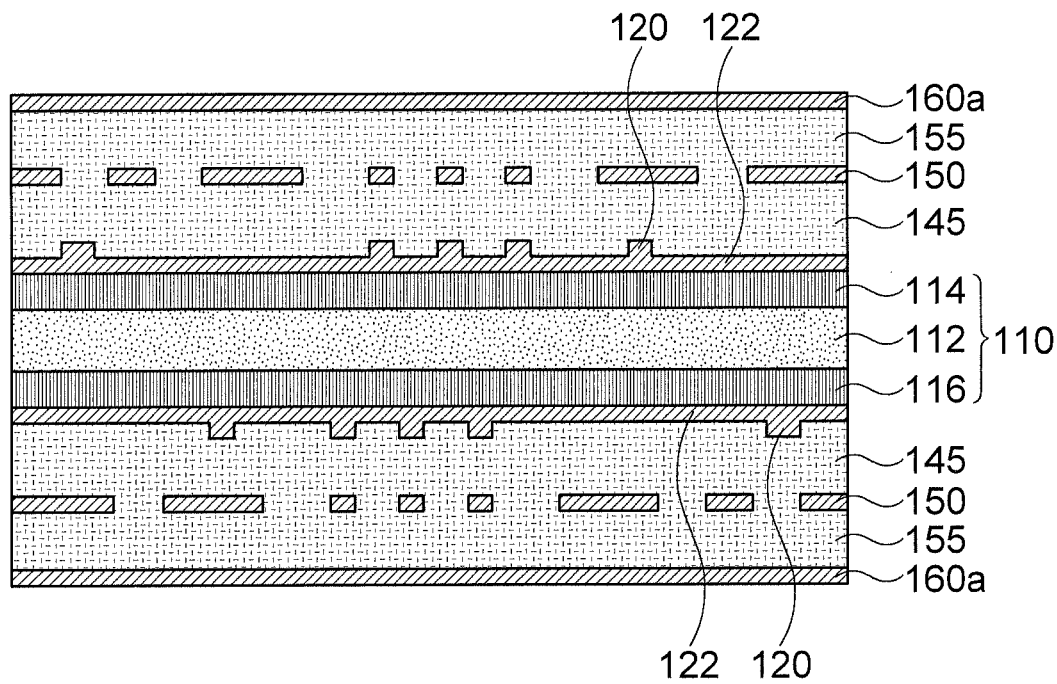

According to FIG. 8, second insulating layers 155 and preliminary third circuit patterns 160a are sequentially formed on the both surfaces of the base substrate 110 on which the second circuit patterns 150 are formed.

More specifically, the second insulating layers 155 and the preliminary third circuit patterns 160a are formed by sequentially laminating an insulating material and a metal material on the both surfaces of the base substrate 110 on which the second circuit patterns 150 are formed.

Figure 9:
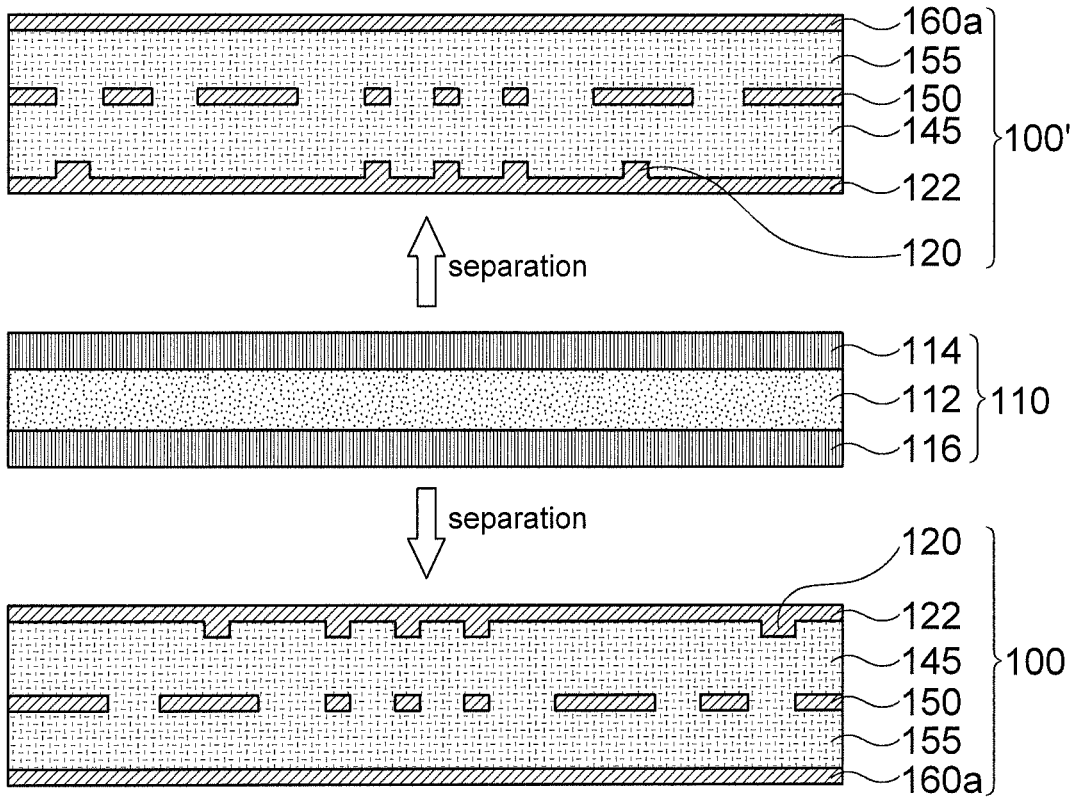

According to FIG. 9, two printed circuit boards 100 and 100' with the same shape are formed by removing the base substrate 110.

At this time, the two printed circuit boards 100 and 100' are not completed products, and the completed printed circuit board 100 is formed according to the following description.

Like this, since the present invention can form the two printed circuit boards 100 and 100' with the same shape on the both surfaces of the base substrate 110 by using the base substrate 110, it is possible to reduce time required for forming a printed circuit board.

Meanwhile, description may be repeated since methods of manufacturing a circuit pattern embedded type board using the two printed circuit boards 100 and 100' are the same. Therefore, only the method of manufacturing one of the two printed circuit boards 100 and 100' will be described below for convenience of description.

Figure 10:
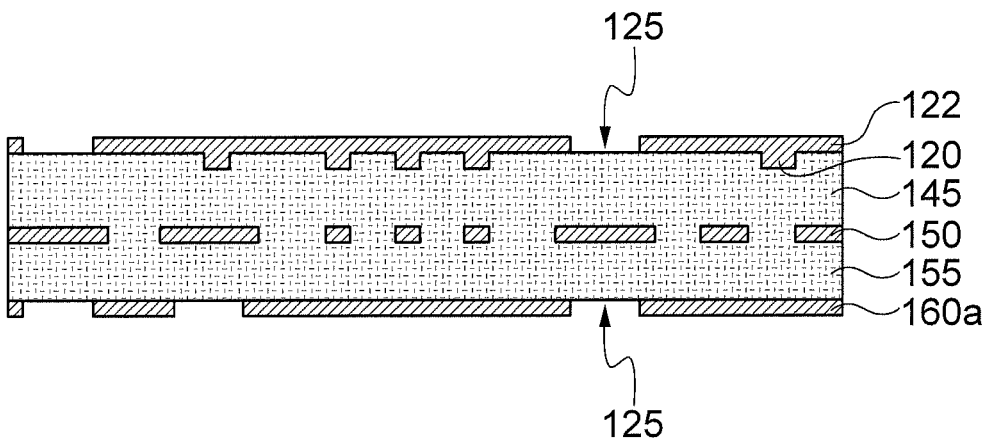

According to FIG. 10, regions in which a first fill-plating layer 170a and a second fill-plating layer 170b are to be formed are opened by removing portions 125 of the first circuit pattern 120 and the preliminary third circuit pattern 160a of the printed circuit board 100.

More specifically, the regions in which the first fill-plating layer 170a and the second fill-plating layer 170b are to be formed are opened by removing the portions 125 of the first circuit pattern 120 and the preliminary third circuit pattern 160a of the printed circuit board 160 through a first removal process.

Figure 11:
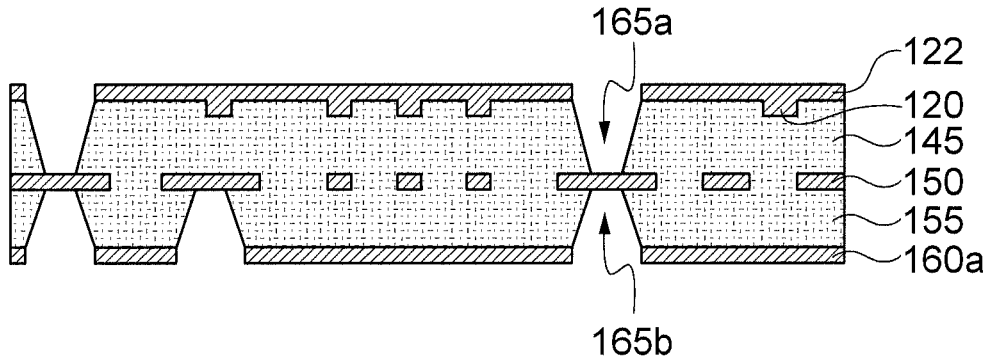

According to FIG. 11, a first hole 165a and a second hole 165b, which penetrate the first insulating layer 145 and the second insulating layer 155, respectively, are formed.

More specifically, a second removal process and a pretreatment process of the fill-plating layer are sequentially performed on the portions 125. At this time, the pretreatment process of the fill-plating layer may include a desmear process of removing various pollutants and foreign materials generated during processing of the first hole 165a and the second hole 165b and a chemical copper process of forming a fine plating layer (not shown) in a hole to allow a current flow before forming the following fill-plating layer.

Then, the first hole 165a, which penetrates the first insulating layer 145 to expose an upper surface of the second circuit pattern 150, is formed, and the second hole 165b, which penetrates the second insulating layer 155 to expose a lower surface of the second circuit pattern 150, is formed.

At this time, for example, the second removal process may be an etching process using a carbon dioxide ($CO_2$) laser.

Figure 12:
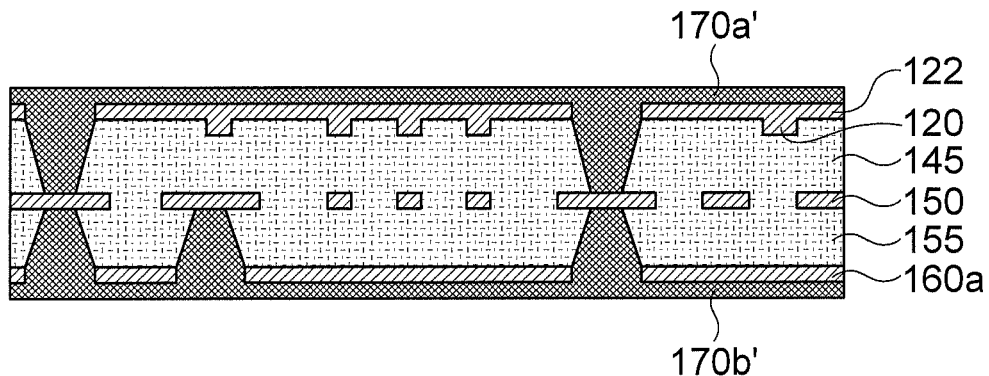

According to FIG. 12, preliminary fill-plating layers 170a' and 170b' are formed to fill the first and second holes 165a and 165b, respectively.

More specifically, as in FIG. 12, the first preliminary fill-plating layer 170a', which covers the exposed surface of the metal layer 122 while filling the first hole 165a, is formed by performing fill-plating on the entire surface of the substrate in which the first and second holes 165a and 165b are formed.

In addition, the second preliminary fill-plating layer 170b', which covers the exposed surface of the preliminary third circuit pattern 160a while filling the second hole 165b, is formed by performing fill-plating on the entire surface of the substrate in which the first and second holes 165a and 165b are formed.

For example, the preliminary fill-plating layers 170a' and 170b' in the present invention may be a conductive material such as copper (Cu).

Figure 13:
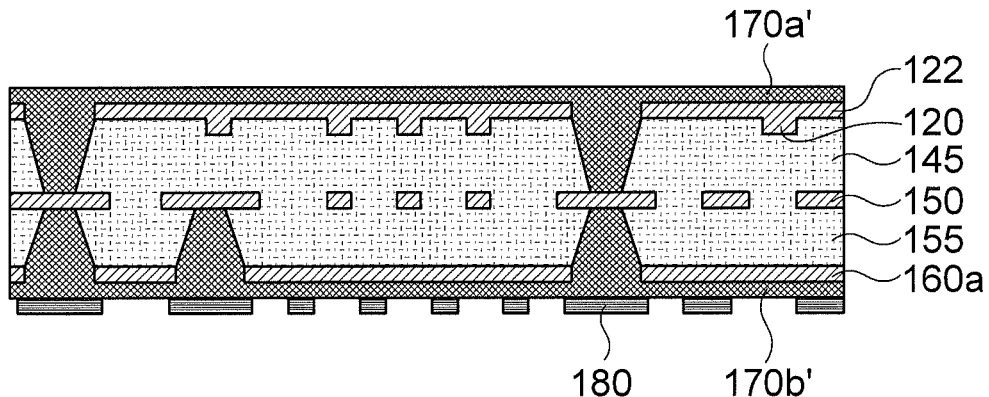

According to FIG. 13, a second insulating film layer 180 is formed on the lower surface of the printed circuit board 100.

More specifically, after applying a photosensitive material to cover the lower surface of the printed circuit board 100, that is, the exposed surface of the second preliminary fill-plating layer 170b', the second insulating film layer 180 is formed by sequentially performing exposure and developing processes. At this time, the second insulating film layer 180 is formed in positions where a land of the second fill-plating layer 170b and a third circuit pattern 175 are to be formed later and can be used as a sacrificial pattern for forming the land of the second fill-plating layer 170b and the third circuit pattern 175.

At this time, the photosensitive material may be various photosensitive materials such as a dry film, photo resist, and photo solder resist as in an embodiment of the present invention and can be replaced with various materials without being limited to the above materials.

Like this, since the second insulating film layer 180 in the present invention is formed on only one surface of the printed circuit board, not on the both surfaces of the printed circuit board, it is possible to reduce manufacturing costs by reducing the amount used of the photosensitive material and reduce manufacturing time by reducing exposure time.

Figure 14:
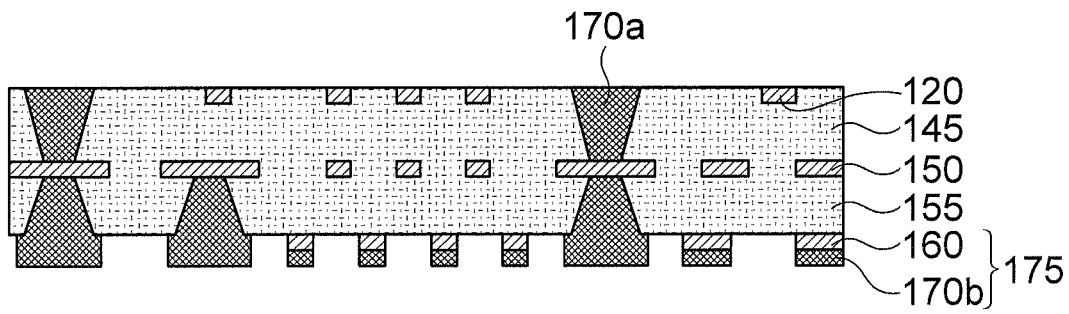

According to FIG. 14, the first fill-plating layer 170a, the second fill-plating layer 170b, and the third circuit pattern 175 are formed on the both surfaces of the printed circuit board 100.

More specifically, as in FIG. 13, an etching process is performed on the entire surface of the printed circuit board 100 on which the second insulating film layer 180 is formed.

Then, the first fill-plating layer 170a, which does not have a land, that is, fills the first hole 165a, is formed by removing a portion of the surface of the first preliminary fill-plating layer 170a'. At the same time, the metal layer 122, which is formed on the upper surface of the printed circuit board 100, is also removed so that only the first circuit pattern 120, which is embedded in the upper surface of the first insulating layer 145, is left as in FIG. 14.

At this time, although the surfaces of the first circuit pattern 120 and the first fill-plating layer 170a are shown to be on the same line with the surface of the first insulating layer 145, the surfaces of the first circuit pattern 120 and the first fill-plating layer 170a may be formed lower than the surface of the first insulating layer 145 without being limited thereto.

In addition, by the etching process, the second insulating film layer 180 formed on the lower surface of the printed circuit board 100 is all removed. Accordingly, the second preliminary fill-plating layer 170b' exposed by the second insulating film layer 180 and the exposed portion of the preliminary third circuit pattern 160a are removed together so that the third circuit pattern 175 and the second fill-plating layer 170b with a land are formed.

Here, as in FIG. 14, the third circuit pattern 175 in accordance with the present invention may be formed by laminating a remaining pattern 160 of the preliminary third circuit pattern 160a and a remaining pattern 170 of the second preliminary fill-plating layer 170b'. And, the third circuit pattern 175 may be formed on the surface of the second insulating layer 155.

Like this, since the first circuit pattern 150 in accordance with the present invention is embedded in the first insulating layer 145 and the first fill-plating layer 170a does not have a land, it is possible to reduce the entire thickness of the printed circuit board.

FIGS. 15 to 19 are plan views and cross-sectional views taken along I-I' of the plan views showing a method of manufacturing the fill-plating layer and the first circuit pattern of the present invention.

Figure 15:
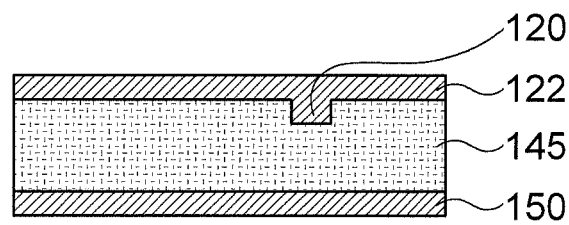
Figure 15:
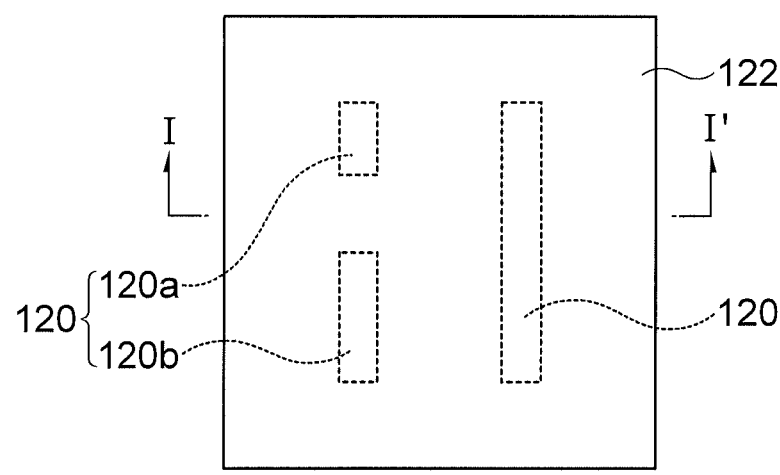

First, according to FIG. 15, the first circuit pattern 120 is formed on the first insulating layer 145.

Here, the first circuit pattern 120 may consist of the metal layer 122 formed in a line shape along the surface of the first insulating layer 145 and the first circuit pattern 120 extending by being protruded from a portion of the metal layer 122 toward the first insulating layer 145.

Meanwhile, the first circuit pattern 120 may be formed in plural as shown in the plan view of FIG. 15.

At this time, one of the plurality of first circuit patterns 120 may consist of a first separator 120a and a second separator 120b separated with the portion 125 interposed therebetween.

In addition, another of the plurality of first circuit patterns 120 may be formed in a line shape extending in a direction parallel to the one fine circuit pattern 120 consisting of the first separator 120a and the second separator 120b while being spaced apart from the one fine circuit pattern 120 by a predetermined distance.

At this time, in the present invention, the first separator 120a and the second separator 120b may be formed to be separated from each other with the portion 125 interposed therebetween, not formed in a line shape like the another first circuit pattern 120, and this predetermined space may be an open region left to open the region where the first fill-plating layer 170a is to be formed later.

Meanwhile, although the second circuit pattern 150 in FIG. 15 is formed in a line shape, the second circuit pattern 150 is shown as a line shape for convenience of description and can be formed substantially in the same shape as the second circuit pattern 150 shown in FIG. 8.

Figure 16:
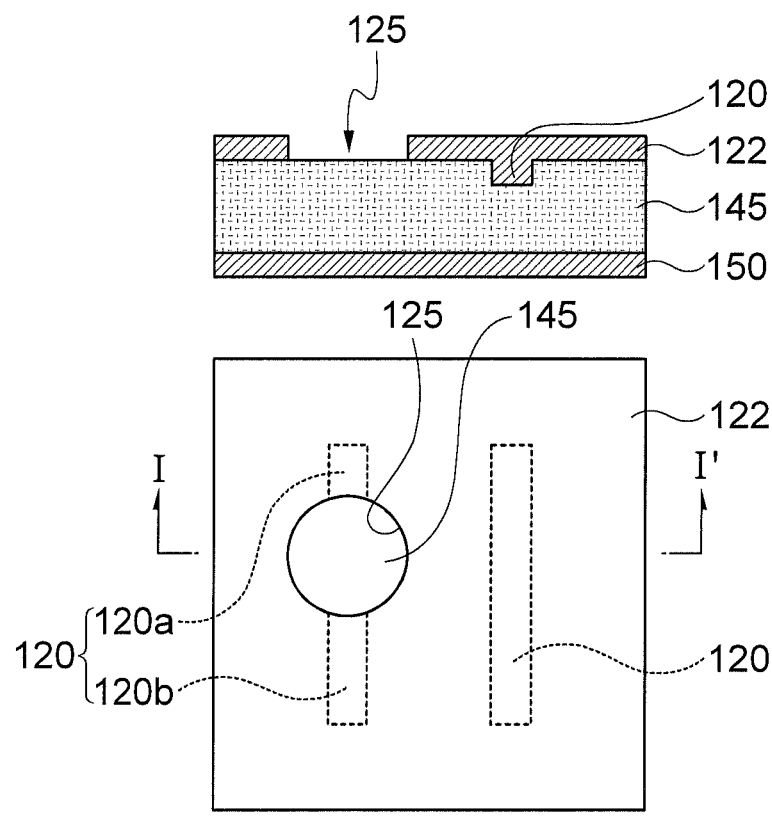

According to FIG. 16, the region where the first fill-plating layer 170a is to be formed is opened by removing the portions 125 of the first separator 120a and the second separator 120b through a first etching process.

The opened region may be formed in a circular shape as in the plan view of FIG. 16 and expose the surface of the first insulating layer 145.

Figure 17:
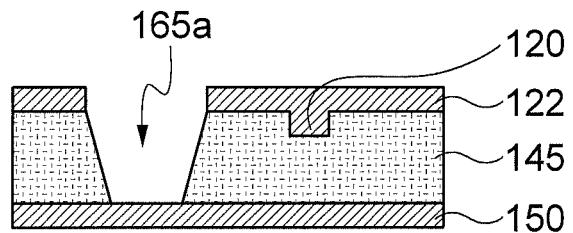
Figure 17:
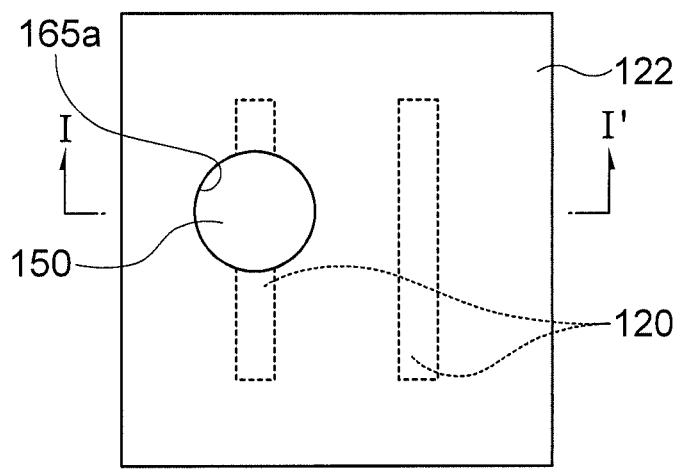

According to FIG. 17, the first hole 165a, which penetrates the first insulating layer 145, is formed by performing the second removal process on the portion 125.

More specifically, as in FIG. 17, the first hole 165a, which penetrates the first insulating layer 145 to expose the upper surface of the second circuit pattern 150, is formed by sequentially performing the second removal process and the pretreatment process of the fill-plating layer on the portion 125.

In the present invention, the pretreatment process of the fill-plating layer may include a desmear process of removing various pollutants and foreign materials generated during processing of the first hole 165a and a chemical copper process of forming a fine plating layer in a hole to allow a current flow before forming the following fill-plating layer.

At this time, as in the plan view of FIG. 17, the first hole 165a may be formed in a circular shape and thus expose the surface of the second circuit pattern 150.

For example, the second removal process in accordance with an embodiment of the present invention may be an etching process using $CO_2$ laser.

Figure 18:
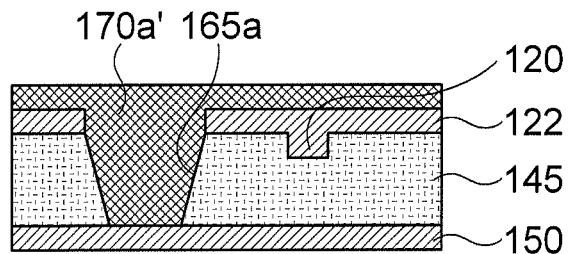
Figure 18:
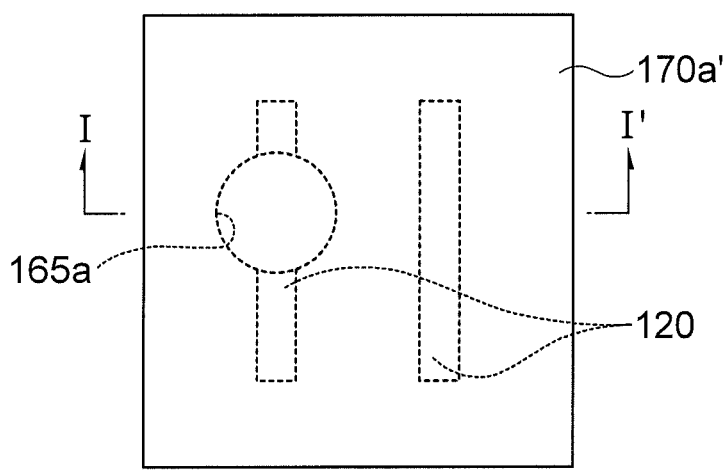

According to FIG. 18, the preliminary fill-plating layer 170a' is formed to fill the first hole 165a.

More specifically, as in FIG. 18, the preliminary fill-plating layer 170a', which covers the exposed surface of the metal layer 122 while filling the first hole 165a, is formed by performing fill-plating on the entire surface of the substrate in which the first hole 165a is formed.

At this time, for example, the metal material may be a conductive material such as copper (Cu).

Figure 19:
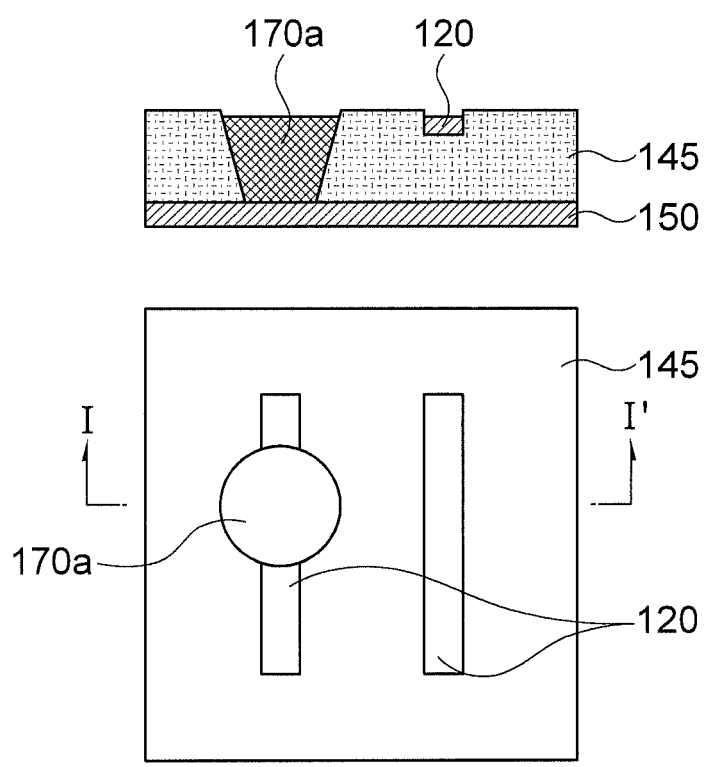

According to FIG. 19, the first circuit pattern 120 and the first fill-plating layer 170a, which fill the inside of the first insulating layer 145, are formed by performing an etching process on the entire surface of the printed circuit board 100 on which the preliminary fill-plating layer 170a' is formed.

At this time, although the surfaces of the first circuit pattern 120 and the first fill-plating layer 170a are shown to be on the same line with the surface of the first insulating layer 145, the surfaces of the first circuit pattern 120 and the first fill-plating layer 170a may be formed lower than the surface of the first insulating layer 145 without being limited thereto.

Like this, the method of manufacturing a printed circuit board in accordance with the present invention can reduce the entire thickness of the printed circuit board by removing the land of the fill-plating layer while forming the circuit pattern to be embedded in the insulating layer.

The embodiments of the present invention relate to a printed circuit board and a manufacturing method thereof, and it is possible to reduce the entire thickness of the printed circuit board by removing the land of the fill-plating layer while embedding the circuit pattern in the insulating layer exposed to the outside. Accordingly, the printed circuit board in accordance with the present invention can implement miniaturization of the circuit pattern.

What is claimed is:

1. A printed circuit board comprising:
a first insulating layer;
a second insulating layer of which one surface is formed to be in contact with the other surface of the first insulating layer;
a first circuit pattern formed to be embedded in one surface of the first insulating layer;
a second circuit pattern formed to be embedded between the first insulating layer and the second insulating layer;
a third circuit pattern formed to be protruded from the other surface of the second insulating layer; and
a landless fill-plating layer for filling a hole which penetrates the first insulating layer,
wherein the landless fill-plating layer fills the hole to a height such that the landless fill-plating layer covers over and connects to at least a portion of a lateral surface of the first circuit pattern facing toward a longitudinal axis of the hole.

2. The printed circuit board according to claim 1, further comprising:
a land fill-plating layer for filling a hole which penetrates the second insulating layer.

3. The printed circuit board according to claim 1,
wherein the third circuit pattern is formed by laminating a remaining pattern of a preliminary third circuit pattern and a remaining pattern of a second preliminary fill-plating layer.

4. The printed circuit board according to claim 1,
wherein the landless fill-plating layer fills the hole to a height such that the landless fill-plating layer covers over and connects to at least a portion of a lateral surface of the first circuit pattern facing toward a longitudinal axis of the hole.

5. The printed circuit board according to claim 1,
wherein the landless fill-plating fills the hole to a height that is substantially level with a surface of the first circuit pattern facing away from the second insulating layer.

* * * * *